Jan. 26, 1971 D. E. COOPER ET AL 3,559,001

SEMICONDUCTOR HOUSING ASSEMBLY

Filed Aug. 21, 1968

INVENTORS
DAVID E. COOPER
ALVIN M. SMITH
BY
Mueller, Aichele & Rauner
ATTORNEYS

United States Patent Office 3,559,001

Patented Jan. 26, 1971

3,559,001

SEMICONDUCTOR HOUSING ASSEMBLY

David E. Cooper and Alvin M. Smith, Scottsdale, Ariz., assignors to Motorola, Inc., Franklin Park, Ill., a corporation of Illinois Filed Aug. 21, 1968, Ser. No. 754,204
Int. Cl. H01l *1/12, 1/14*
U.S. Cl. 317—234 7 Claims

ABSTRACT OF THE DISCLOSURE

A large area junction rectifier die is supported on an annular shelf of a carrier formed of electrically insulating plastic molded material. Encased in the molded material is a ring type electrode having an outwardly extending terminal for exterior connection. A wire connects the gate electrode of an SCR to the ring type electrode. A pair of opposed flexible electrodes are pressure contactable with opposing sides of the semiconductor die and are firmly held against the carrier shelf by a unitary plastic molded ring which compresses an outward portion of the flexible contacts against the carrier. A pair of electrical contacts extending radially outward of the ring respectively contact the flexible electrodes such that axial and peripheral electrical connections can be made to each opposing side of the semiconductor die. The carrier is useful for testing the die before the assembly is completed. The carrier permits plastic encapsulation in an annular molding die such that no pressure is exerted on the semiconductor die.

BACKGROUND OF THE INVENTION

This invention relates to semiconductor package assemblies and methods for fabricating same.

Rectifier assemblies of the higher voltage type, i.e., thousands of volts of reverse voltage capability, have been fabricated in the ring type of structure wherein the current conducting or electrifying electrodes are coaxially disposed and held in place by the ring with a rectifier die being disposed between the opposed electrodes and held in place by the ring. When being used, the opposed electrodes are pushed axially against each other to form a pressure electrical contact with opposite sides of the semiconductor die. To date most of such devices have used rather expensive ceramic rings which require brazing contacts to the ceramic for making a hermetic seal. Also, these devices are not testable until assembly has been hermetically completed. Therefore, if there is damage to the die during the assembly process it is not detected until the expensive package has been completed. In many instances, the ceramic ring consists of two parts requiring four peripheral brazing operations.

After the pressure type of rectifier assembly is disposed in a housing for connection to the electrical equipment, it is desirable that external connections be made to the assembly. To date such external connections, in addition to the main current or circuit connection, have required additional contacts on the equipment. Sometimes this is awkward because of the heat dissipation required immediately adjacent the rectifier assembly, i.e., heat radiating fins fill the space immediately around the rectifier assembly. Therefore, it is desirable if external connections could be provided to the rectifier assembly in addition to the two circuit connections pressed against the semiconductor die.

SUMMARY OF THE INVENTION

An object of this invention is to provide a low cost plastic sealed semiconductor assembly wherein the semiconductor die is tested inside a carrier forming a part of the ultimate package.

It is another object of this invention to make a plastic sealed electrical assembly wherein the plastic sealing provides no pressure against an electrical unit inside the package.

A further object is to provide a plastic encapsulating annular die arrangement.

A feature of this present invention is a ring shaped plastic or other insulated carrier having a radially inward extending circular shelf for supporting a semiconductor die or other electrical unit. Conductor means are encapsulated in the insulating ring.

Another feature of the invention is the combination of a pair of opposed flexible contacts held firmly against the carrier mentioned in the previous feature by an insulating ring.

Another feature of the invention is the method of manufacturing the above-mentioned device wherein a plastic encapsulating operation is used to form an outer unitary member which provides no force on the interior of the package, all of the force of the plastic encapsulation being absorbed by the insulating carrier ring.

Another feature of the present invention is the radially outwardly extending electrical terminals in ohmic relation to the axial terminals forming pressure contacts with the semiconductor die or other electrical unit.

A semiconductor or electrical assembly according to this invention has a ring type carrier with conductor means encapsulated therein and extending radially inward and outward from the insulating ring. An insulated shelf is formed on the radially inward portion for receiving a semiconductor die having a large area junction or other electrical unit. The die also has a pair of oppositely facing electrodes and if it is a gate controlled type of device (SCR) has a gate electrode which is wire bonded to the conductor means. A pair of pressure contact type of contacts are disposed in pressure contact relation to the opposite faces of the semiconductor die and have a radially outward circumferential portion on opposite sides of the insulating ring. The assembly is then placed in a plastic encapsulating molding machine which has a cavity receiving the outer portion of the insulating ring and the circumferential portion of the two pressure contact members. The cavity is radially outward of the inward portion of the insulating ring such that when the mold is closed all of the plastic encapsulating pressure is applied to the insulating ring and the radially outward portion of the two pressure contact members. None of the pressures are imposed upon the central core portion of the pressure contact members and, therefore, no pressure is applied to the semiconductor die or other electrical unit supported by the carrier.

A pair of electrical terminals may be inserted into the cavity such that they are radially outward and in contact in relation to the respective pressure contact members performing not only an actual connection to the semiconductor die but a radially outward connection to the die. The unitary plastic ring resulting from the plastic molding operation forms a seal around the outer edge of the rectifier assembly. The moisture path for entering inside the assembly goes radially outward on the outer surface of the respective pressure contact members, then radially inward on the surfaces between the pressure contact members and the insulating ring carrier. Such elongated moisture paths help ensure that the moisture does not enter the assembly for causing degradation of the semiconductor die. Additionally, the die may be covered with a silicone rubber for protecting the edge of the junction along its tapered edge.

THE DRAWING

DETAILED DESCRIPTION OF THE ILLUSTRATIVE EMBODIMENT

Figures 1, 3, 4:
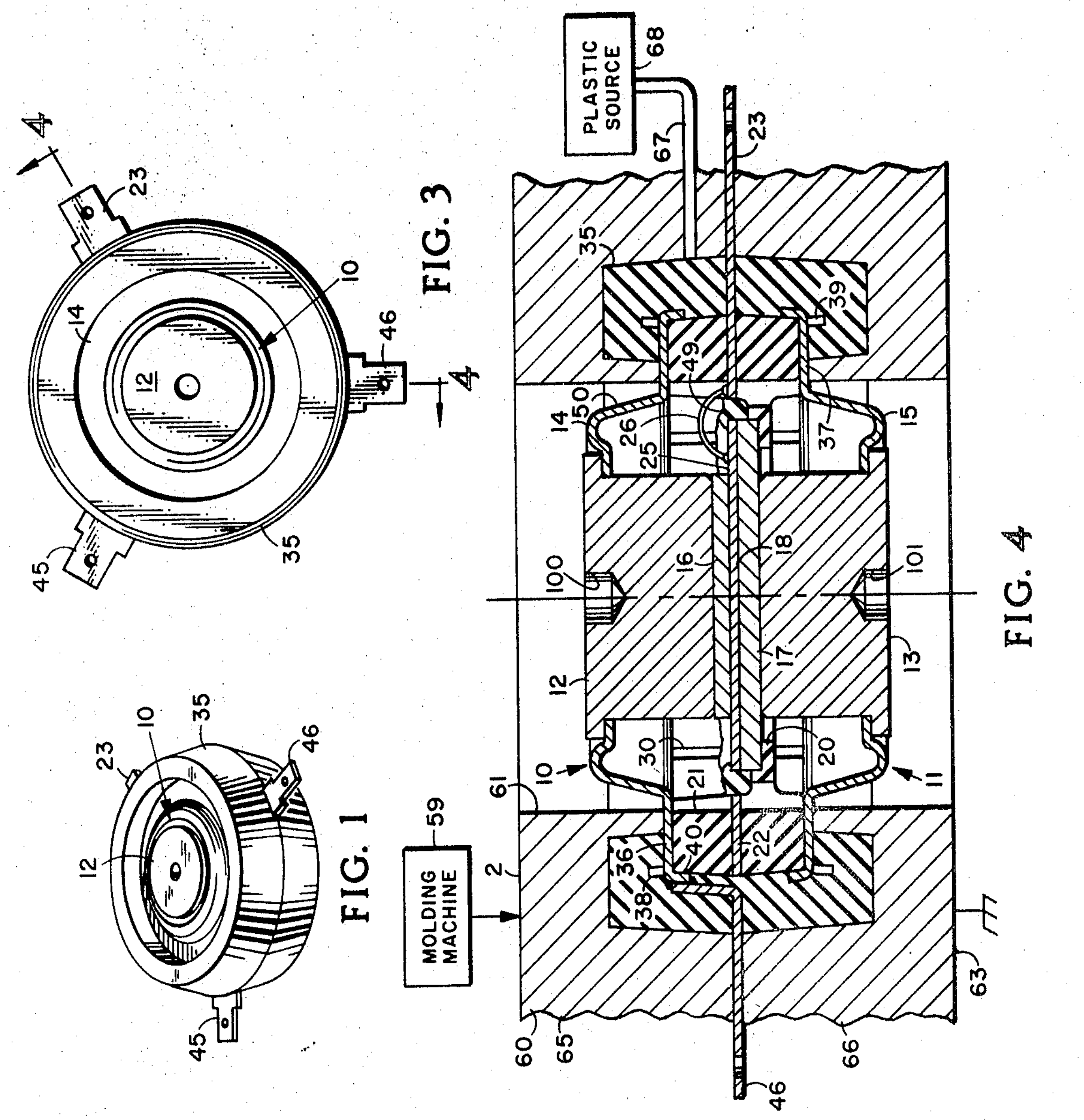
FIG. 1 is an isometric view of an ultimate device incorporating the teachings of the present invention.
FIG. 3 is a plan view of an ultimate device.
FIG. 4 is a diagrammatic enlarged sectional view taken along the lines 4—4 of FIG. 3, and further includes a diagrammatic showing of an annular set of dies in a molding machine used to fabricate the locking or outer ring of the ultimate assembly.

Referring now more particularly to the drawing, like numbers indicate like parts and structural features in the various views. The pressure contact rectifier assembly includes a pair of identical pressure contact members 10 and 11 each having a large heat and electrical conductive center cores 12 and 13. Annular flexible metallic portions 14 and 15 are respectively brazed to the center cores 12 and 13 for forming a hermetic seal therebetween. By applying pressure to the axially outward surfaces of the cores 10 and 11, an electrical pressure contact is made against the two electrodes 16 and 17 of semiconductor die 18 which contains a rectifying junction (not shown). Therefore, an electrical circuit of a rectifying nature is completed between core 12 and core 13. The die 18, together with its supporting electrode 17, rests on and is secured to an inward circumferentially extending shelf 20 integrally formed on a die carrier including the insulating annular ring 21. Ring 21 secures a ring type conductor 22 having a radially outwardly extending connection 23. As shown in the drawing, a semiconductor die 18 is a thyristor having a gate electrode portion 25 with a wire 26 forming an electrical connection between the gate electrode 25 and ring shaped conducting means 22. The insulating ring carrier 21 has a plurality of radially inwardly facing recesses 30 which expose a metallic ring conductor means 22 for facilitating connections between the conductor means 22 and the gate electrode 25. On some thyristors it is desired to make several connections through a plurality of wires 26. The plurality of recesses 30 permits such plurality of connections for making an effective ring connection to a gate electrode. To effect such plural connections, an annular unitary lead frame may be disposed over and in electrical contact with gate electrode 25 and conducting means 22.

The assemblage shown in FIG. 1 is designed such that a plurality of electrical elements may be inserted and used therein in conjunction with the semiconductor die 18 or any other electrical unit that is in electrical connection with pressure contact members 10 and 11. Such additional electrical elements are disposed over the silicone material 49 in the annular space between the center cores 12 and 13 and the carrier insulating ring 21.

Several electrical connections can be made to the semiconductor die 18 by wire bonding or through the use of lead frames which are plastic encapsulated in the insulating ring 21 in a known manner. For example, many thyristors, such as represented by semiconductor die 18, are triggered to current conduction and nonconduction by a triac or three-layer diode. Such diode can be supported on gate electrode 25 with the wire 26 providing the control connection to conducting means 22. Further integrated circuit control and other electroresponsive means may be inserted in the annular space between the cores 12 and 13 and ring 21. When such electrical elements are included in the package, instead of a unitary conducting means 22 extending circumferentially around the semiconductor die 18 within ring 21, a lead frame having a plurality of electrically separate conducting means, i.e., one conducting means at each of the recesses 30, may be imbedded in plastic insulating ring 21. In such an instance, a like plurality of outwardly extending electrical connection means, such as terminal 23, are provided in electrical connection with the respective conducting means in the recesses 30. In addition thereto, the terminals 45 and 46 may be provided for a radial connection to the axial electrical contacts formed by the pressure contact members 10 and 11.

As best seen in FIG. 4, an outer locking annular unitary plastic ring 35 is molded around the outer circumferential portions 36 and 37 of the two pressure contact members 10 and 11 forcing same against the insulating carrier ring 21 for forming a tight seal therebetween. Tabs 24 of conducting means 22 locate conducting means 22 during molding ring 21 and then extend radially outward of ring 21 to lock the carrier to the outer plastic ring 35. The pressure contact members 10 and 11 have a plurality of deformed upstanding ends 38 and 39 for securely locking the outer plastic ring 35 to the pressure contact members. Additionally, each of the pressure contact members has axially inwardly extending portions 40 which extend respectively axially toward the carrier ring 21. These portions 40 terminate somewhat short of making an electrical connection with conductor means 22 and are used to make an electrical contact to additional terminals 45 and 46. The terminals 45 and 46 are brazed to the axial portions 40 and spaced from the conducting means 22 to avoid electrical contact therewith. Terminal 45 is in electrical connection with the pressure contact member 10 and terminal 46 is in electrical connection with pressure contact member 11. Therefore, there is provided a pair of radially outwardly extending electrical contact terminals 45 and 46 which bring the axial connections afforded by pressure contact members 10 and 11 to a radially outward position of the outer plastic ring 35. These radially outward connections facilitate adding capacitors, resistors, test equipment, and the like to a rectifier after it is inserted into a pressure contact rectifier holding equipment (not shown) which makes electrical connections to the pressure contact members 10 and 11. The gate electrode 25, of course, is connected through terminal 23 to a control circuit (not shown) for control of the thyristor or semiconductor action of die 18. It is understood, of course, that a two-terminal rectifier assembly may be used in place of a thyristor with the elimination of terminal 23. Additionally, transistors or other electrical devices of diverse types may be incorporated into the present structure with the terminal 23 forming the one contact, the pressure contact members 10 and 11 forming axial electrical contacts with the terminals 45 and 46 providing additional contacts to the contact members 10 and 11.

Plastic pressure sealing against a metallic or other surface does not provide a hermetic seal in the classic sense; however, there is provided a relatively good barrier against moisture penetration. For example, moisture being deposited on the outer surface 50 of pressure member contact 10 must move radially outwardly between the ring 35 and the outer portion 36 of contact member 10. Then it must extend down over depending portions 40 or enter through the groove left by the axially outwardly extending portions 38, then move along the interface between insulating ring 21 and the radially outward portion 36 of pressure contact member 10. Because of the sharp turn involved, there are high pressure areas between outer plastic ring 35 and the radially outward portion 36 which form a relatively good moisture barrier; that is, moisture has a difficult time in moving around the end of the portion 36. Another entry way for moisture into the assembly is along the terminal 23 through both the outer plastic ring 35 and the insulating ring 21. Because of the interface between the two rings, there is additional pressure provided at the surface of terminal 23 and this, together with the length of the path, reduces the possibility of moisture contamination inside the assembly.

In the event a hermetically sealed package in the classic sense is desired, the unitary outer ring 35 may be replaced by a two-piece ceramic ring having two identical parts. One part is first brazed to the peripheral section 36 of pressure contact member 10. The second half of the ring, which corresponds to the bottom half of outer ring 35 residing in die 66 (FIG. 4), is brazed to the peripheral portion 37 of pressure contact member 11. With such construction, the axially extending portions 36 and 40 may be dispensed with. To obtain a radial electrical connection, as by terminals 45 and 46, radially extending grooves are formed in the ceramic rings and the contact members 45 and 46 are then made to extend axially along inner ring 21 and thence to be brazed or otherwise connected to the peripheral portion 36 or 37, as appropriate. In such event, the conducting means 22 must terminate radially inward of the outer end if ring 21 wherein the terminals 45 and 46 reside. In other words, the radially outward extensions 24 of conducting means 22 are dispensed with. The three parts, including the ceramic rings, are then disposed one on the other and the two ceramic parts are then brazed together to form a hermetically sealed package. The other variations of the package, as described for the unitary plastic encapsulatring 35, may be utilized with the ceramic rings. It is pointed out that the use of the ceramic ring will increase the cost of the package over that provided with the cost of the package including the outer plastic ring 35. Also, if both packages are desired to be produced, the ceramic rings to be substituted for the plastic outer ring 35 may be formed, such as to receive the axially extending portions 38 and 40.

Figure 2:
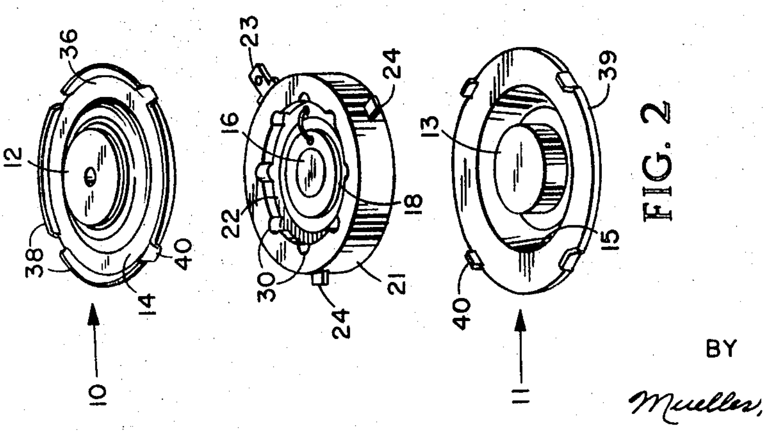
FIG. 2 is an exploded isometric view of the carrier and the pressure contact members of a device showing their cooperative relationship in the ultimate device illustrated in FIG. 1.

As best seen in FIG. 2, the carrier, including insulating ring 21, receives the semiconductor die 18 with the two electrodes 16 and 17 and is usable therein as the carrier while in a semiconductor production line. After the die 18 has been placed on the annular shelf 20, it is tested and can be further processed. Before assembly, a silicone rubber or other type of sealing compound 49 (FIG. 4) is placed intermediate die 18 and the inner surface of insulating ring 21 for protection of the junction and other portions of semiconductor die 18. It is important that the outer surfaces of electrodes 16 and 17 not be covered because of the electrical connections to be made.

For reducing costs, the outer insulating ring 35 is formed by transfer or injection molding of plastic insulative material. To this end, the assembly, including pressure contact members 10 and 11 and the carrier 21 with its die 18, is placed in the cavity of a molding machine 59. Molding machine 59 has an annular die set 60 with a hollow core 61. Upper or movable die 65 faces and closes against stationary or lower die 66 which is suitably supported at surface 63. An annular or cylindrical mold cavity is formed between the two dies 65 and 66—which cavity corresponds to the cross-sectional areas of outer ring 35 and the radially outward portions 36 and 37 extending into boxes 65. When the dies are closed, the pressure on the assembly 10, 11, 21 is limited to that portion between the two annular dies 65 and 66 to be entirely on the radially outward portion of the assembly. After closure, plastic encapsulating material is inserted into the mold cavity through mold runner 67 from plastic source 68. The contact members 10 and 11, inner cores 12 and 13, as well as the flexible portions 14 and 15, are disposed in hollow core 61 of the annular dies remote from the die cavities and, therefore, receive no pressure thereon. For this reason, semiconductor die 18 cannot be damaged during any molding operation. Damage during transfer molding operation of plastic encapsulated devices has been caused by pressure imposed upon the semiconductor die during a molding operation. The present die configuration eliminates this problem.

The present invention may be utilized to fabricate electrical assemblies not using pressure electrical contacts. For example, a device having a flexible axially outwardly extending lead or leads may be constructed. In such an instance, member cores 12 and 13 are respectively soldered or otherwise bonded to electrodes 16 and 17 plus flexible leads (not shown) being inserted into the cores 12 and 13 as through one or both of the coaxial center locating recesses 100 and 101. A threaded stud (not shown) of known design may be substituted for one or both of such flexible leads. Of course, other variations in the structure may be made within the true scope thereof.

What is claimed is:

1. An electrical assembly, including the combination, a ring-shaped electrically insulative carrier having a central opening with a shelf-type support means extending into the opening and conductor means adjacent said shelf-type means and extending radially outwardly through said ring-type carrier, an electrical device on said shelf-type means, a pair of pressure contact members each having a central core adapted to be in electrical contact relation to said electrical device on opposite sides thereof, respectively, and having an outward portion in intimate circumferential contact around said insulating carrier, a locking ring around said insulating carrier and at least a portion of said outer portions for holding said contact members and said carrier together and forming a seal therebetween, and said conductor means having a terminal extending radially outwardly of said locking ring for providing at least one electrical connection between said electrical device and a radially outward portion of said locking ring.

2. The apparatus of claim 1 wherein said carrier has a plurality of inwardly opening axially extending recesses for exposing a large area of said conductor means for facilitating connection between said electrical device and said conductor means.

3. The apparatus of claim 1 further including an electrical terminal means extending into said locking ring and having an axially extending end portion in electrical connection with one of said pressure contact members.

4. The apparatus of claim 3 wherein said one pressure contact member has an axially extending portion disposed over said insulating ring carrier and extending toward said electrical terminal means end portion and being in physical contact therewith for forming an electrical connection.

5. The apparatus of claim 4 wherein said depending means on said one pressure contact member includes a plurality of axially extending portions radially outward of and in contact with said carrier for centering said one pressure contact member thereon and further including a portion axially extending opposite to said last mentioned portions for locking said locking ring to said one pressure contact member.

6. The apparatus of claim 5 wherein said both of said pressure contact members have axially extending portions and further including a second terminal means extending into said locking ring in electrical contact with another one of said pressure contact members such that all electrical connections to the electrical device may be made radially outward of said locking ring.

7. The apparatus of claim 1 wherein said locking ring is a unitary plastic cylindrical ring compressing said outward portions against said carrier.

References Cited

UNITED STATES PATENTS

| | | | |
|---|---|---|---|
| 3,437,887 | 4/1969 | Nowalk et al. | 317—234 |
| 3,443,168 | 5/1969 | Camp et al. | 317—234 |

JOHN W. HUCKERT, Primary Examiner

R. F. POLISSACK, Assistant Examiner

U.S. Cl. X.R.

29—577, 588; 317—235